(12) United States Patent
DelPrete et al.

(10) Patent No.: US 7,133,288 B2
(45) Date of Patent: Nov. 7, 2006

(54) PROCESSOR HEAT SINK RETENTION MODULE AND ASSEMBLY

(75) Inventors: Stephen Damian DelPrete, Rehoboth, MA (US); Donald Phillip Amaral, Jr., Seekonk, MA (US)

(73) Assignee: Tyco Electronics Corporation, Middletown, PA (US)

(*) Notice: Subject to any disclaimer, the term of this patent is extended or adjusted under 35 U.S.C. 154(b) by 212 days.

(21) Appl. No.: 10/848,975

(22) Filed: May 19, 2004

(65) Prior Publication Data

US 2005/0259399 A1    Nov. 24, 2005

(51) Int. Cl.
H05K 7/20 (2006.01)
H01L 31/024 (2006.01)

(52) U.S. Cl. ............... 361/719; 361/718; 257/718; 257/719

(58) Field of Classification Search ........... 361/704, 361/718, 719; 257/718, 719
See application file for complete search history.

(56) References Cited

U.S. PATENT DOCUMENTS

| | | | |
|---|---|---|---|
| 6,145,586 A * | 11/2000 | Lo | 165/80.3 |
| 6,525,941 B1 * | 2/2003 | Lai | 361/697 |
| 6,542,367 B1 | 4/2003 | Shia et al. | |
| 6,549,412 B1 * | 4/2003 | Ma | 361/704 |
| 6,570,763 B1 | 5/2003 | McHugh et al. | |
| 6,574,109 B1 | 6/2003 | McHugh et al. | |
| 6,611,431 B1 * | 8/2003 | Lee et al. | 361/719 |
| 6,646,881 B1 * | 11/2003 | Lai et al. | 361/719 |
| 6,654,254 B1 * | 11/2003 | Szu et al. | 361/760 |
| 6,778,396 B1 * | 8/2004 | Liu | 361/719 |
| 6,826,052 B1 * | 11/2004 | Ma | 361/709 |
| 6,854,993 B1 * | 2/2005 | McHugh et al. | 439/196 |
| 2004/0105236 A1 * | 6/2004 | Lee et al. | 361/704 |

* cited by examiner

Primary Examiner—Anatoly Vortman

(57) ABSTRACT

A heat sink retention module for an electronic device includes a base comprising mounting lugs configured to be mounted to a circuit board, and frame elements extending between the mounting lugs to define at least one keep out area interior to the frame elements and at least one keep out area exterior to the frame elements. The frame elements include at least one frame element extending at an oblique angle to another of the frame elements, and heat sink retention posts extend vertically upward from the frame elements.

20 Claims, 5 Drawing Sheets

US 7,133,288 B2

PROCESSOR HEAT SINK RETENTION MODULE AND ASSEMBLY

BACKGROUND OF THE INVENTION

This invention relates generally to heat sinks for electronic devices, and more specifically, to mounting and retention systems for heat sinks.

The use of heat sinks on electronic components is well known. Typically, a heat sink is arranged in close contact with a heat generating electronic component, such as a Central Processing Unit (CPU). As the power density of such components increases, heat transfer from the heat generating component to the surrounding environment becomes more and more critical to the proper operation of the component. Heat generated by the component is transferred to the heat sink and then dissipated from the heat sink to the surrounding air. One type of heat sink includes a metallic core in the form of a base plate. Heat dissipating fins extend from the base plate to increase the surface area of the heat sink. Heat transferred from the component to the base plate is spread throughout the base plate and to the fins fixed to the base plate. To further facilitate the dissipation of heat from the electronic component, a fan can be used to circulate air about outer surfaces of the fins and the base of the heat sink.

In the case of a CPU, known circuit board designs typically provide for the heat sink to be mounted directly on top of the CPU in a retention module that is in turn mounted on the circuit board. The heat sink is nested within the retention module, and a spring clip or other fastening mechanism and hardware is used to retain the heat sink to the retention module and apply a normal force to the heat sink to maintain physical contact between the heat sink and the CPU to ensure thermal flow of heat from the CPU to the heat sink.

In the past, certain processors have been specified for use with a particular retention module, and the retention module was commonly provided with the circuit boards for easy mounting of CPU's and heat sink assemblies. Consequently, heat sink assemblies and mounting hardware was designed for use with the retention modules. One example of such a retention module pertains to the widely used Intel Pentium 4 processors.

Next generation processors, such as the Intel Prescott T processor, requires a different layout in the circuit board than the Pentium 4 processors, thereby rendering known retention modules and heat sink assemblies incompatible with the new processors. Developing new heat sinks and hardware assemblies for mounting of the heat sinks on the new processors and circuit board layouts is a difficult and expensive proposition. Additionally, meeting the increased heat transfer needs of more powerful processors adds to the challenge of cooling new processor technology.

BRIEF DESCRIPTION OF THE INVENTION

According to an exemplary embodiment of the present invention, a heat sink retention module for an electronic device is provided. The retention module comprises a base comprising mounting lugs configured to be mounted to a circuit board, and frame elements extending between the mounting lugs to define at least one keep out area interior to the frame elements and at least one keep out area exterior to the frame elements. The frame elements include at least one frame element extending at an oblique angle to another of the frame elements, and heat sink retention posts extend vertically upward from the frame elements.

Optionally, the retention module is compatible with a socket T configuration on a first end and compatible with a heat sink assembly on a second end opposite the first end. The mounting lugs may include a bottom surface and threaded inserts extending into the mounting lugs from the bottom surface. At least one of the heat sink retention posts may include a heat sink alignment tab.

In accordance with another exemplary embodiment, a heat sink assembly is provided. The assembly comprises a circuit board comprising a top surface and a bottom surface, and a retention module. The retention module comprises a base comprising mounting lugs fastened to the top surface of the board via mounting apertures accessible only from the bottom surface of the circuit board when the mounting lugs are abutted to the top surface of the circuit board. A plurality of frame elements extend between the mounting lugs to define at least one keep out area interior to the frame elements and at least one keep out area exterior to the frame elements. The frame elements include at least one frame element extending at an oblique angle to another of the frame elements, and a plurality of heat sink retention posts extend vertically upward from the frame elements.

According to yet another exemplary embodiment, a heat sink assembly comprises a circuit board having a socket T configuration. A retention module is provided which is compatible with the socket T configuration on a first end and compatible with a heat sink assembly on a second end opposite the first end. The retention module comprises a base comprising mounting lugs fastened to the top surface of the board via mounting apertures accessible only from the bottom surface of the circuit board when the mounting lugs are abutted to the circuit board. Frame elements extend between the mounting lugs to define at least one keep out area interior to the frame elements and at least one keep out area exterior to the frame elements, the frame elements including at least one frame element extending at an oblique angle to another of the frame elements. Heat sink retention posts extending vertically upward from the frame elements, and the heat sink retention posts are arranged in first and second oppositely facing pairs, wherein the first and second pairs are substantially aligned with one another.

DETAILED DESCRIPTION OF THE INVENTION

Figure 1:
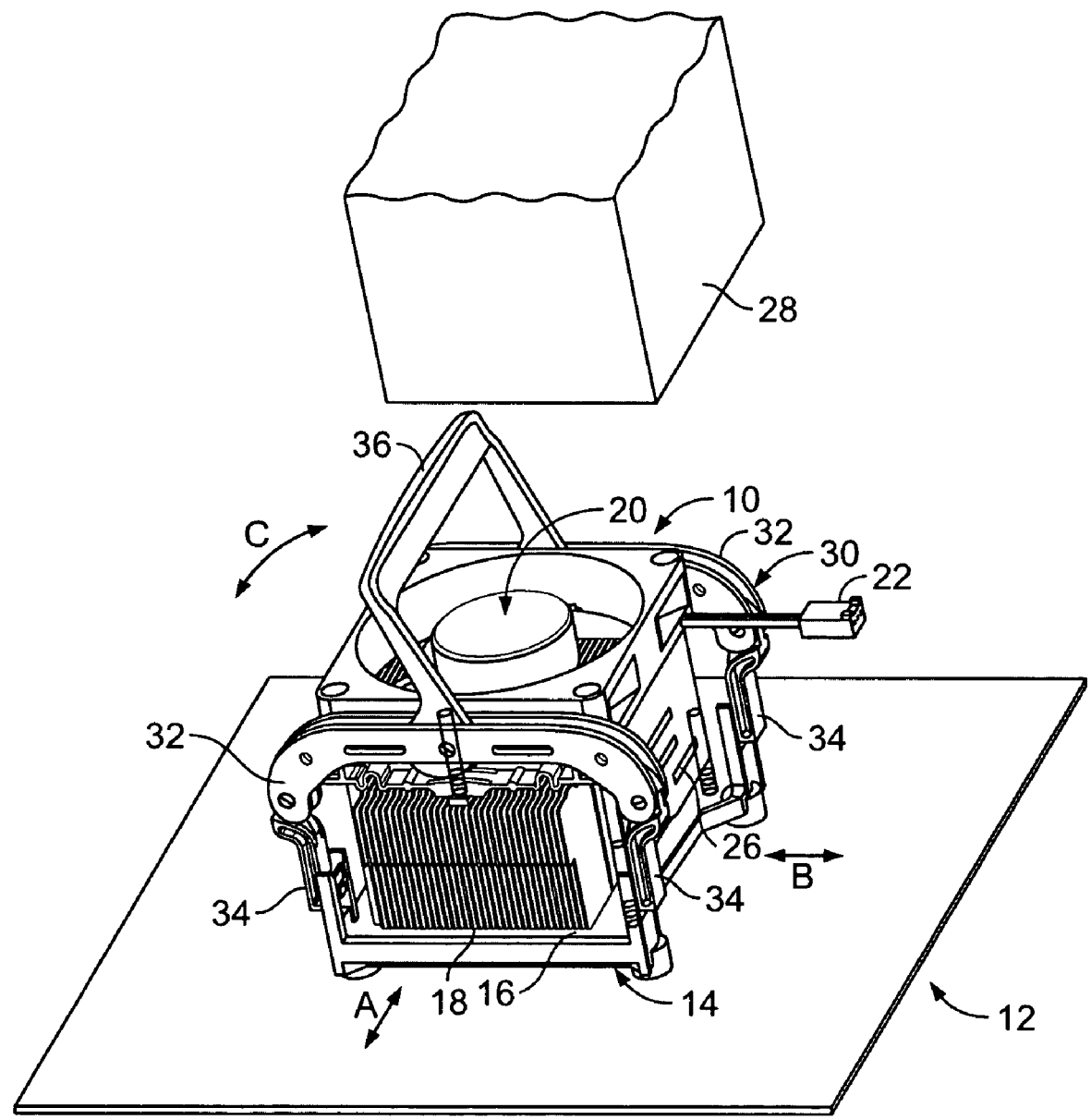
FIG. 1 is a perspective view of an exemplary heat sink assembly mounted to a circuit board.

FIG. 1 is a perspective view of an exemplary heat sink assembly 10 mounted to a circuit board 12 and retained thereto with a retention module 14 formed according to an exemplary embodiment of the present invention. As explained below, the retention module 14 allows a relatively low cost heat sink assembly 10 to be used with new and more powerful electronic devices, including but not limited to next generation processors, while using existing hardware configurations to retain the heat sink assembly 10 to the device. This is achieved despite differences in the layout of the circuit board 12 (also described below) for the electronic device which would otherwise render known retention modules incompatible and unusable with the circuit board 12. Adequate heat transfer for newer electronic devices may therefore be provided at relatively low cost using existing hardware and heat sink constructions. Thus, time and expense associated with designing and developing a new line of heat sink assemblies for next generation electronic devices may be spared.

In an illustrative embodiment, the heat sink assembly 10 includes a base 16 having a plurality of slots therein which receive plate-like heat transfer fins 18 generally aligned with, but spaced from, one another on the base 16. In one embodiment, the base 16 includes a base plate fabricated from, for example, aluminum, and an insert or slug (not shown) in the base plate that is fabricated from a different material (e.g., copper or silver) having a higher thermal conductivity than the base plate. The insert increases the thermal conductivity of the base plate and reduces spreading resistance that inhibits rapid heating of the base plate.

In an exemplary embodiment, the fins 18 are fabricated from aluminum and crimped to the base in a known manner. The fins 18 provide an increased surface area for heat transfer from an electronic device (not shown in FIG. 1) in thermal contact with the base 16. Heat is therefore transferred from the electronic device to the base 16, and from the base 16 to the heat dissipating fins 18 where the heat is discharged to the ambient environment.

A fan element 20 is mounted over the top of the fins 18 and includes a rotating blade (not shown) which displaces air over the exposed surfaces of the fins 18. A plug 22 is electrically connected to a fan motor, and when the plug 22 is connected to a power supply, the motor drives the fan blade and circulates air across the fins 18. In one embodiment, when the fan element 20 is operating, air is blown downwardly over the top of the fins 18 and parallel to the plane of the fins 18 (i.e., in a direction of arrow A in FIG. 1). In a further embodiment, the fins 18 include slots 26 therethrough which allow air to flow laterally through the fins 18 (i.e., in a direction parallel to arrow B in FIG. 1). By providing air flow in both a longitudinal direction (arrow A) between the fins 18 and a lateral direction (arrow B) through the fins 18, heat transfer efficiency is increased relative to known heat sinks wherein air is circulated primarily only in one direction.

Also considering that the heat sink assembly 10 and circuit board 12 are typically mounted in a chassis (not shown) of a larger device (e.g., a cabinet of a PC), and unlike known heat sink assemblies, a fresh air duct 28 is provided which is in fluid communication with outside air. Thus, unlike conventional heat sink assemblies, the fan element 20 draws cool outside air and circulates the cooler air over the fins 18, and does not simply circulate air inside the chassis, which is usually warmer than outside air. The use of cooler outside air also increases heat transfer efficiency in comparison to known heat sink assemblies. Thus, while the electronic device to be cooled by the heat sink assembly 10 may be more powerful and have increased heat transfer needs in comparison to lower power devices, better airflow through the fins 18 and the use of cooler fresh air circulated by the fan element 20 provides sufficient heat transfer improvements to cool higher power electronic devices without having to use redesigned, higher capacity heat sinks.

A retainer mechanism 30 couples the heat sink base 16, the fins 18, and the fan element 20 in a heat transfer relationship to the electronic device via the retention module 14. The retainer mechanism 30 includes spaced brackets 32 and retainer arms 34 pivotally mounted to the ends of the brackets 32. The retainer arms 34 include hooked ends which engage the retainer module 14 as described below. A handle element 36 is rotatably mounted to the brackets 32, and the handle is rotatable relative to the brackets 32 in the direction of arrow C between latched and unlatched positions. When in the latched position, the retainer mechanism 30 provides a downward clamping force to ensure physical contact between the heat sink base 16 and the electronic device to be cooled.

In an illustrative embodiment, the heat sink assembly 10 is a known assembly which has been previously been used on existing electronic devices, such as Intel Pentium 4 processors. The particular heat sink assembly 10 illustrated in FIG. 1 is commercially available from Tyco Electronics Corporation of Harrisburg, Pa. as Part No. 8-1542008-7. The heat sink assembly 10 is but one example, however, of a heat sink assembly which may be used in the present invention, and the description of the heat sink assembly is therefore provided for purposes of illustration rather than limitation.

The retention module 14 permits the use of an established heat sink assembly, such as the assembly 10, to be used with next generation electronic devices as explained below. In particular, the retention module 14 permits the heat sink assembly 10 to be used with an Intel Prescott T processor configuration, which requires a different circuit board layout than did predecessor devices, such as the Intel Pentium 4 processors.

Figure 2:
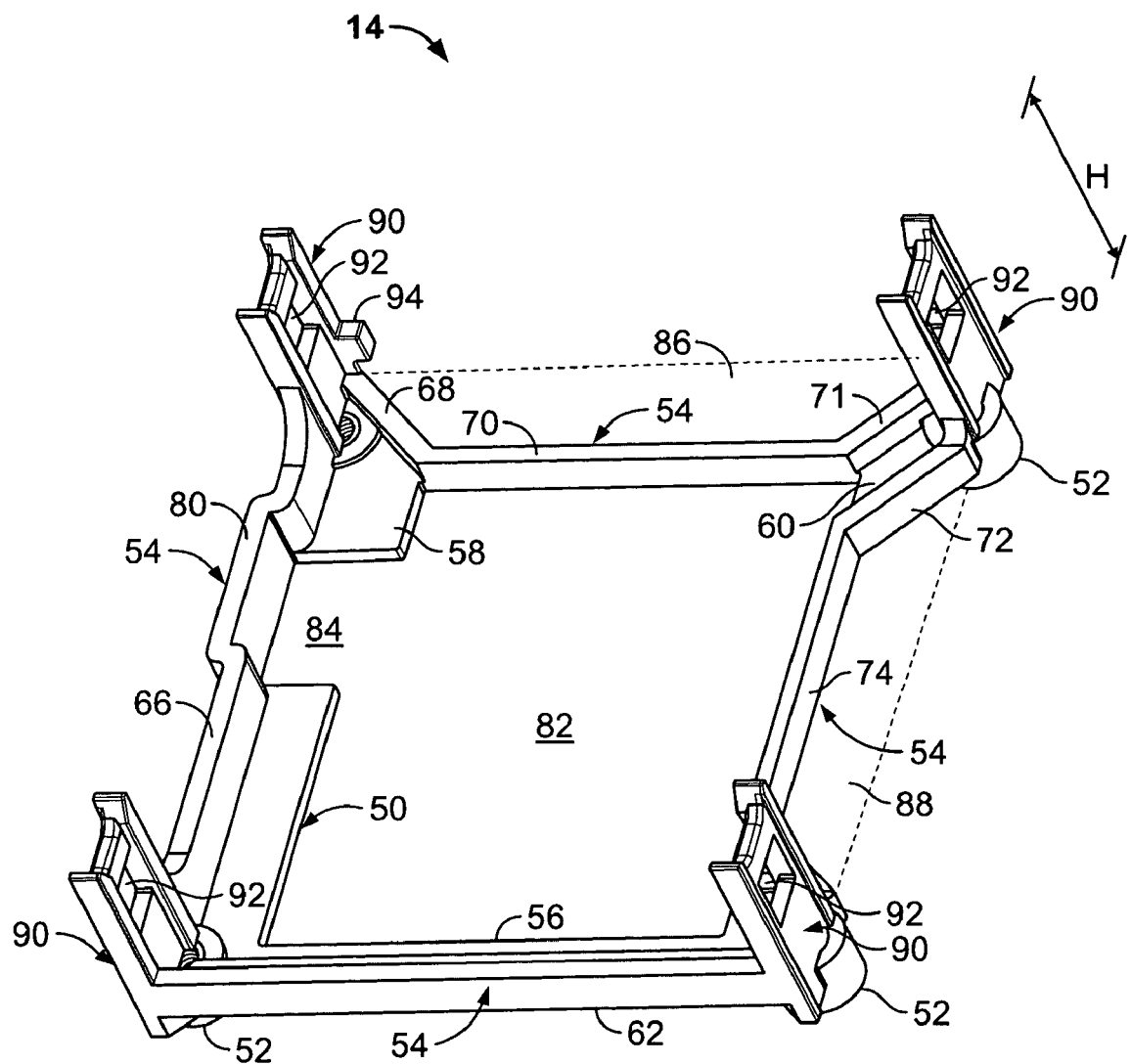
FIG. 2 is a perspective view of a retention module for the heat sink assembly shown in FIG. 1.
Figure 3:
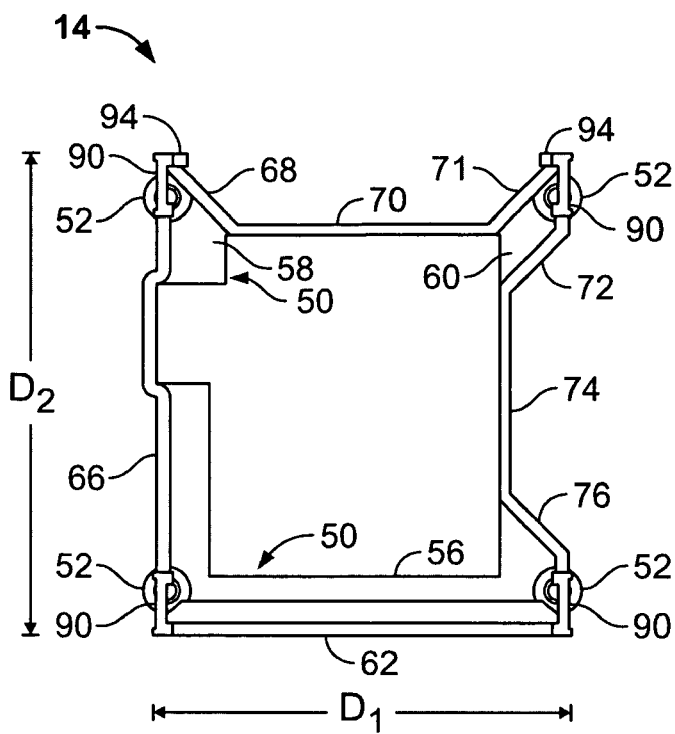
FIG. 3 is a top plan view of the retention module shown in FIG. 2.

FIGS. 2 and 3 are a perspective view and top plan view, respectively, of an exemplary retention module 14 which may be used to couple the heat sink assembly 10 to a next generation processor device. The retention module 14 includes a generally planar base 50, mounting lugs 52 extending downward from the base 50, and frame elements 54 extending upward from the base 14.

The base 50 includes a U-shaped section 56 which connects a first pair of mounting lugs 52, and corner sections 58, 60 extending from each of the remaining mounting lugs 52 situated opposite the U-shaped section 56. The frame elements 54 include a straight frame element 62 extending along the bottom of the U-shaped section 56, and a notched frame element 66 extending substantially perpendicular to the straight frame element 62. An angled frame element 68 extends from the notched frame element 66 at an oblique angle thereto, and a frame element 70 extends from an end of the angled frame element 68 in a parallel orientation to the straight frame element 62. Angled frame members 71, 72 extend upward from the base corner section 60 and connect the frame element 70 and a frame element 74 to a mounting lug 52 located opposite the U-shaped base section 56 and also located opposite the notched frame element 66. The frame element 74 extends substantially parallel to the notched frame element 66, and an angled frame element 76 connects the frame element 74 to a mounting lug 52 which is located adjacent the nearest corner of the U-shaped base section 74 and on one end of the straight frame element 62.

It is seen from FIGS. 2 and 3 that the frame elements 62, 66, 70 and 74 are arranged in a substantially rectangular pattern, and the frame elements 68, 71, 72 and 76 extend obliquely to the side edges of the rectangle and effectively extend three of the four corners of the rectangle outwardly.

Only the corner defined by the straight frame element 62 and the notched frame element 66 remains at a natural corner of the rectangular pattern formed by the frame elements 54. The notched frame element 66 includes an outwardly displaced notch 80 extending between one end of the U-shaped base section 56 and one of the base corner sections 58.

The foregoing frame elements 54 define, cooperatively with the base 50 of the retention module 14, keep out zones for the electronic device to be cooled. More specifically, the frame elements 62, 66, 70, 74, the U-shaped section 56 and the corner sections 58, 60 of the base 50 define an interior keep out zone 82 which is substantially rectangular in shape with a side extension 84 adjacent the notch 80 of the frame element 66. The frame element 70 and the angled frame elements 68 and 71 define a first exterior keep out area 86 therebetween, and the frame element 74 and the angled frame elements 72 and 76 define a second exterior keep out area 88 therebetween. Unlike the interior keep out zone 82 which is enclosed by the frame elements 54, the exterior keep out areas 86 and 88 are open (i.e., not enclosed) by the frame elements 54. In other words, the interior keep out area 82 is inside the frame members 54, and the exterior keep out areas 86 and 88 are outside the frame members 54 of the retention module 14.

In an exemplary embodiment, and as further described below, the interior and exterior keep out areas 82, 86 and 88 correspond to a Socket T layout configuration compatible with, for example, the Intel Prescott T processor. Other keep out areas may be advisable in alternative embodiments for use with other electronic devices as those in the art will appreciate.

Retention posts 90 extend upward from the frame elements 54 at the four corners of the retention module 14. The posts 90 are arranged in opposite pairs, with each of the posts 90 in each pair facing one another. Retention openings 92 are provided in each of the posts 90, and the hooked ends of the retention arms 34 (shown in FIG. 1) are received in the retention openings 92 when the heat sink assembly 10 (shown in FIG. 1) is attached to the retention module 14. As best seen in FIG. 3, the retention posts 90 are substantially centered over the mounting lugs 52.

As illustrated in FIG. 3, the retention posts 90 of each facing pair are positioned at an end-to-end distance $D_1$ of approximately 3.0 inches (76.2 mm) measured along the straight frame element 62 and the frame element 70. The pairs of retention posts 90 are positioned an approximate end-to-end distance $D_2$ of approximately 3.52 inches (89.41 mm) from one another. Thus the retention module 14 is slightly longer in dimension $D_2$ than in dimension $D_1$. The retention posts 90 extend for an approximately total height H (shown in FIG. 2) of 1.219 inches (30.95 mm). The dimensions $D_1$, $D_2$ and H are selected for compatibility with, for example, the heat sink assembly 10 described above. By locating and dimensioning the retention posts 90 as described above, the retention module 14 may be used with a wide variety of heat sink assemblies available front a host of manufacturers, because the configuration of the posts 90 replicates retention posts of previous retention modules which have been supplied with circuit boards and used with previous electronic devices, such as the Intel Pentium 4 processors.

As also illustrated in FIG. 3, positioning tabs 94 extend inwardly toward facing retention posts 94 adjacent the frame element 70 and the exterior keep out area 86. The tabs 94 serve to guide and center the heat sink assembly 10 over the retention module 14 when the heat sink assembly 10 is installed to the retention module 14 as described below.

In an exemplary embodiment, the retention module 14 is formed from known materials, such as a Lexan plastic material, according to a known process, including but not limited to a molding process. However, it is appreciated that other suitable materials may be employed to fabricate the retention module 114 according to various fabrication techniques known in the art.

Figure 4:
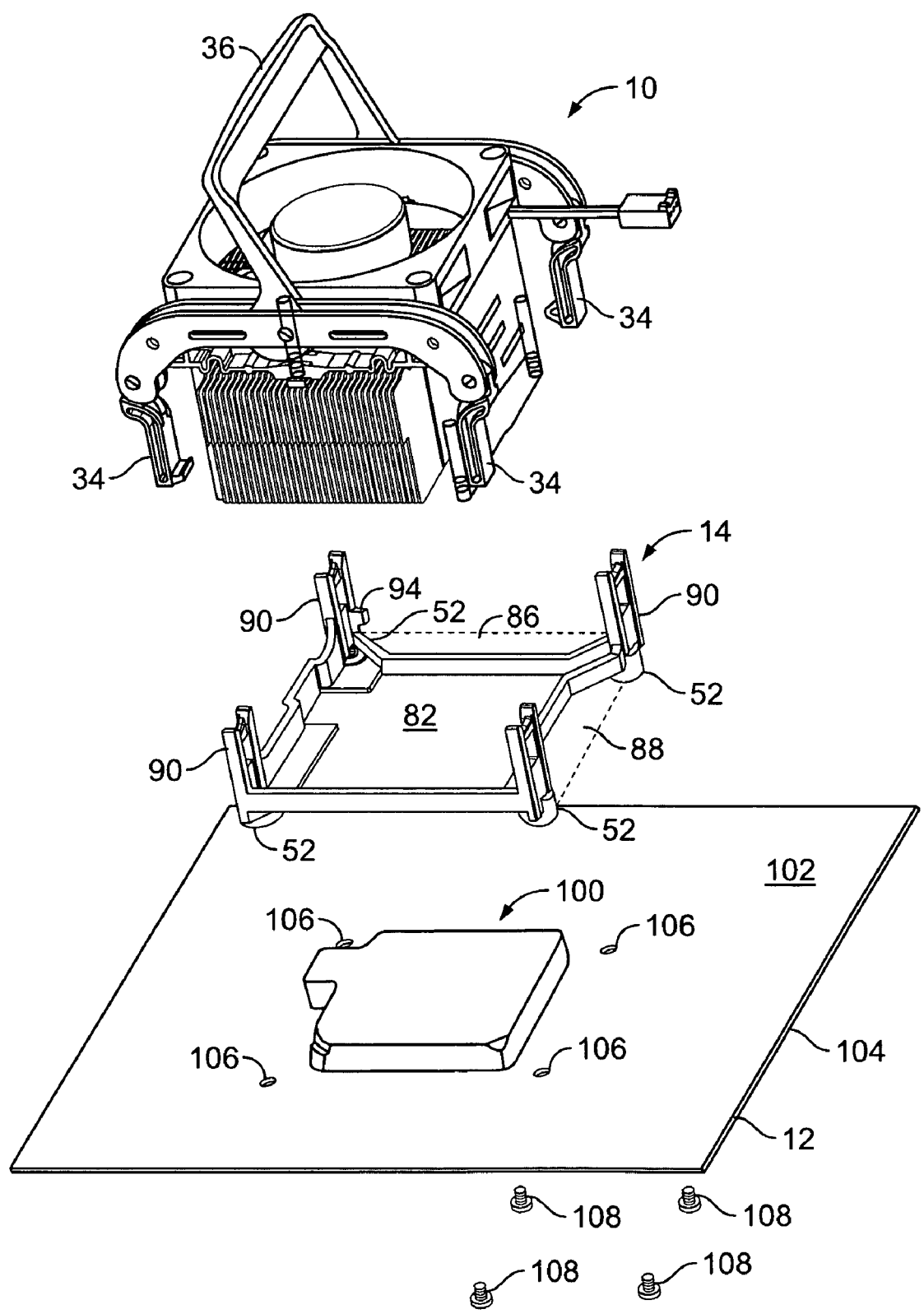
FIG. 4 is an exploded view of the assembly shown in FIG. 1.

FIG. 4 is an exploded view of the overall assembly shown in FIG. 1 wherein the electronic device 100 is schematically illustrated in a mounted relationship to the circuit board 12. The device 100, may be, for example, an Intel Prescott T processor contained in a socket, and in outline the device 100 is substantially contained within the interior keep out area 82 defined by the retention module 14.

The circuit board 12 includes a top surface 102, a bottom surface 104 opposite the top surface 102, and a plurality of through holes 106 extending through the board 12 from the top surface 102 to the bottom surface 104. The retention module 14 is abutted to the top surface 102 of the board 12 in a position wherein the mounting lugs 52 are generally aligned with the through holes 106 in the board 12. Fasteners 108 extend through the through holes 106 from the bottom surface 104 of the board 12 and engage the mounting lugs 52 resting upon the top surface 102 of the board 12. Thus, the retention module 14 is bottom mounted to the circuit board 12. Bottom mounting of the retention module 14 not only provides a secure mechanical connection but avoids the keep out areas required by the electronic device 100 which are otherwise violated in a top mount configuration with fasteners extended through the board from the top surface 102. Once the retention module 14 is mounted to the board 12, the electronic device 100 is surrounded by the base 50 and frame elements 54 of the retention module 14, and the exterior keep out areas 86 and 88 are preserved.

Once the retention module 14 is installed to the board 12, the heat sink assembly 10 may be lowered over the retention module, and using the positioning tabs 94 as a guide, the heat sink assembly 10 may be substantially centered between the retention posts 90 until the retention arms 34 are be hooked over the retention openings 92 (shown in FIG. 3) of the retention posts 90. From this position, the handle element 36 may be moved to the latched position, clamping the heat sink assembly 10 to the electronic device 100 and applying a normal contact force between the heat sink and an outer surface of the electronic component 100.

Figure 5:
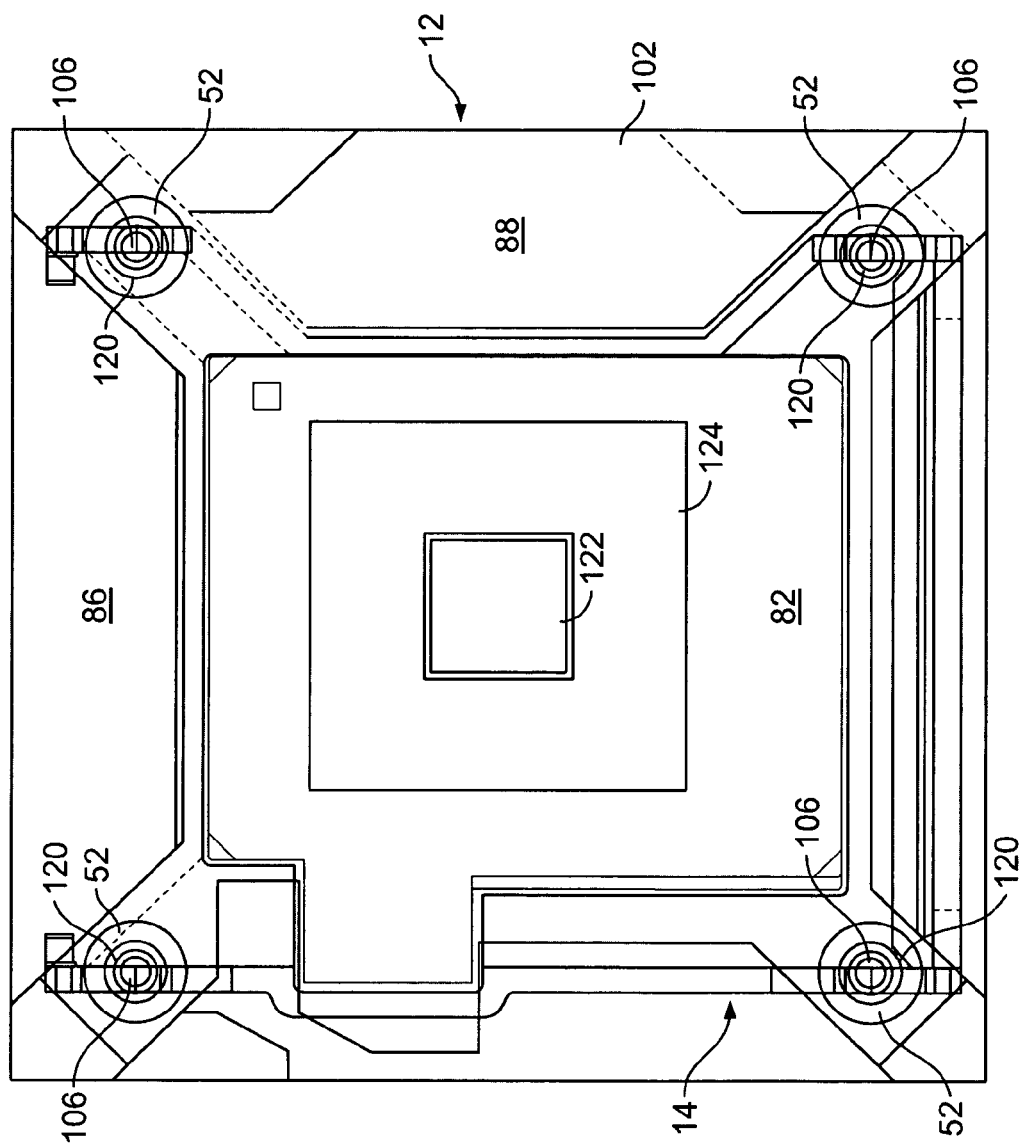
FIG. 5 is a top plan schematic view of a circuit board layout for the assembly shown in FIG. 1.

FIG. 5 is a top plan schematic view of a portion of the circuit board 12 illustrating the layout of components upon the top surface 102 of the board 12. The retention module 14 is located on the board with the mounting lugs 52 generally aligned with the through holes 106 in the board 12. Threaded inserts 120 are insert molded into the mounting lugs 52 and are aligned with the through holes 106 such that the fasteners 108 may be inserted through the bottom of the board 12 via the through holes 106 and engage the threaded inserts 120. The inserts 120 are accessible only from the bottom surface of the board 12 for fastening to the board, and the inserts 120 are generally obstructed (i.e., not accessible for fastening) by the retention posts 90 when viewed from the top surface of the board 12. That is, the retention module 14 may be mounted to the board 12 only from the bottom of the board 12, and it is not possible to mount the retention module 14 from above.

In one embodiment, the inserts 120 are fabricated from stainless steel, although it is appreciated that other suitable materials, including but not limited to brass, may be employed to construct the inserts 20. It is further understood that the inserts 120 are optional and may be eliminated in another embodiment.

It is contemplated that in alternative embodiments, the threaded inserts 120 need not be provided. For example, self tapping screws may be employed to fasten the retention module 14 to the board 12 without the use of threaded inserts. Still further, the retention module 14 may be fastened to the board with pins extending through the board 12 in lieu of threaded inserts.

The frame elements 54 of the retention module 14 define the interior keep out area 82, and a processor 122 is engaged to a socket assembly 124 within the confines of the interior keep out area 82. In one embodiment, the processor 122 is an Intel Prescott T processor, and the socket 124 is a "Socket T" or Land Grid Array (LGA) socket having 775 pins which interface with conductive pads on the bottom of the processor 122. This configuration is sometimes referred to as an LGA-775 CPU, and the Prescott T processor is but one example of a newer electronic device having such a configuration. Portions of the interior keep out area 82 which are not physically occupied by the processor 122 and socket 124, are reserved for ancillary components used with the processor, or simply to provide safety clearances around the processor and related components. Likewise, the exterior keep out areas 86 and 88 of the retention module 14 provide clearance and/or space for components to be used with the processor 122.

Figure 6:
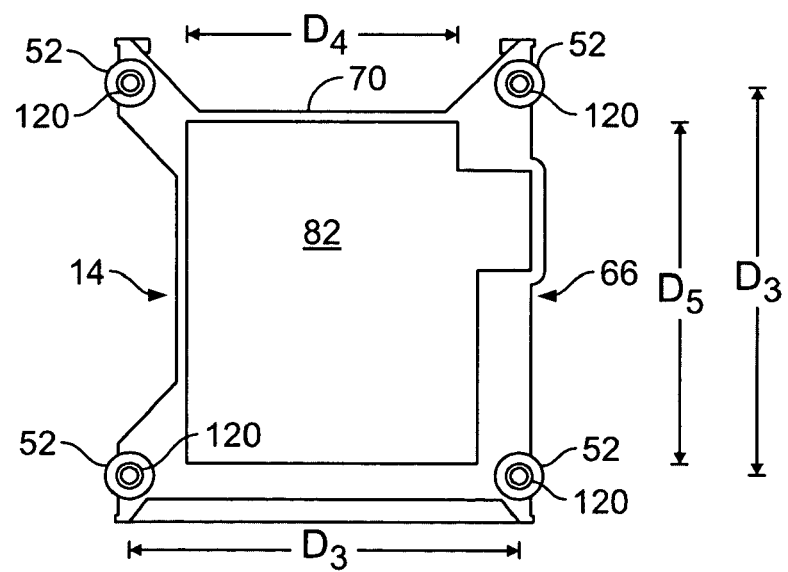
FIG. 6 is a bottom plan view of the retention module shown in FIG. 2.

FIG. 6 is a bottom plan view of the retention module 14 illustrating the mounting lugs 52 having the threaded inserts 120 therein. Adjacent threaded inserts 120 in the mounting lugs 52 are located a center-to-center distance $D_3$ of approximately 2.835 inches (72.0 mm), and the mounting lugs 52 and inserts 120. Thus, while the outer dimensions $D_1$ and $D_2$ (see FIG. 3) of the retention module 12 are unequal, the center-to-center distance $D_3$ between the mounting lugs 52 and the inserts 120 is equal for each of the sides of the retention module. The center-to-center distance $D_3$ of the lugs 52 and inserts 120 matches a center-to-center distance of the through holes 106 (shown in FIGS. 4 and 5) of the circuit board 12.

As also illustrated in FIG. 6, the interior keep out zone 82 is defined by a distance $D_4$ measured along the frame element 70 of approximately 2.008 inches (51.0 mm) and a dimension $D_5$ of approximately 2.494 inches (63.35 mm) measured along the notched frame element 66. The general layout and dimensions illustrated in FIGS. 5 and 6 is herein referred to as a "Socket T layout."

A retention module 14 is therefore provided which is compatible with the Socket T layout, including applicable keep out areas, on a lower end of the module 14 which abuts a circuit board 12 and surrounds an electronic device to be cooled such as the processor 122 and socket 124 of FIG. 5. Meanwhile, an upper end of the retention module 14, namely the retention posts 90, are compatible with a known heat sink assembly 10. Costs of designing and developing a new heat sink assembly for the next generation processor devices are therefore avoided.

Additionally, by using a heat sink assembly 10 having aluminum fins crimped to a copper base, by providing a fresh air duct 28 for the fan element 20, and by providing slots 26 in the fins 18 for lateral and longitudinal airflow therebetween, a lower capacity and less expensive heat sink assembly may be used to cool a higher power electronic component, such as the Intel Prescott T processor. Thus, more expensive and elaborate heat sinks may be avoided.

While the invention has been described in terms of various specific embodiments, those skilled in the art will recognize that the invention can be practiced with modification within the spirit and scope of the claims.

What is claimed is:

1. A heat sink retention module for an electronic device, said retention module comprising:
    a base comprising mounting lugs configured to be mounted to a circuit board;
    frame elements extending between said mounting lugs to define at least one keep out area interior to said frame elements and at least one keep out area exterior to said frame elements, said frame elements including first and second frame elements intersecting at a corner and extending from said corner substantially perpendicular to one another and said frame elements including an angled frame element extending at an oblique angle to said first and second frame elements; and
    a first heat sink retention posts located at said corner and extending vertically upward from an intersection of said first and second frame elements; and
    a second heat sink retention post, extending upward from an outer end of said angled frame element at a location that is closer to said keep out area exterior to said frame element than a distance of said first heat sink retention post from said keep out area exterior to said frame elements.

2. A heat sink retention module in accordance with claim 1 wherein said retention module is compatible with a socket T configuration on a first end and compatible with a heat sink assembly on a second end opposite said first end.

3. A heat sink retention module in accordance with claim 1 wherein said heat sink retention posts comprise four retention posts located at respective corners of said retention module, wherein a distance between adjacent corners on a first edge of said retention module is different than a distance between adjacent corners on a second edge of said retention module.

4. A heat sink retention module in accordance with claim 3 wherein said retention post on said angled frame element is located adjacent said keep out area exterior to said frame elements.

5. A heat sink retention member in accordance with claim 1 wherein said keep out area exterior to said frame elements is defined by a central frame element having opposite ends, and angled frame elements extending from each of said opposite ends to respective retention posts.

6. A heat sink retention member in accordance with claim 1 wherein said mounting lugs comprise a bottom surface and threaded inserts extending into said mounting lugs from said bottom surface.

7. A heat sink retention member in accordance with claim 1 wherein at least one of said heat sink retention posts comprises a heat sink alignment tab.

8. A heat sink assembly comprising:
    a circuit board comprising a top surface and a bottom surface; and
    a retention module comprising:
        a base comprising mounting lugs fastened to said top surface of said board via mounting apertures accessible only from said bottom surface of said circuit board for fastening said base to said circuit board when said mounting lugs are abutted to said top surface of said circuit board;
        a plurality of frame elements extending between said mounting lugs to define at least one keep out area interior to said frame elements and at least one keep out area exterior to said frame elements, said frame elements including at least one frame element extending at an oblique angle to another of said frame elements; and a plurality of heat sink retention posts extending vertically upward from said frame elements, one of said retention posts extending upward from an outer end of said angled frame element remote from said keep out area interior to said frame elements.

9. A heat sink assembly in accordance with claim 8 wherein said keep out area exterior to said frame elements is defined by a central frame element having opposite ends, and angled frame elements extending from each of said opposite ends to respective retention posts.

10. A heat sink assembly in accordance with claim 8 wherein at least one of said first and second pairs of heat sink retention posts comprises heat sink alignment tabs configured to center a heat sink assembly therebetween.

11. A heat sink assembly in accordance with claim 8 wherein said mounting lugs each comprise a threaded insert extending therein.

12. A heat sink assembly in accordance with claim 8 wherein said retention post on said angled frame element is located adjacent said keep out area exterior to said frame elements.

13. A heat sink assembly in accordance with claim 12 wherein said mounting lugs have a center-to-center spacing of approximately 72 mm.

14. A heat sink assembly in accordance with claim 8 wherein said retention posts are substantially centered upon said mounting lugs.

15. A heat sink assembly in accordance with claim 8 wherein said plurality of retention posts comprises four retention posts arranged in first and second oppositely facing pairs, wherein said first and second pairs are substantially aligned with one another, said oppositely facing posts in each pair separated from one another by a first distance, and said pairs of posts separated by a second distance, said second distance different from said first distance.

16. A heat sink assembly comprising:
a circuit board having a socket T configuration; and
a retention module compatible with said socket T configuration on a first end and compatible with a heat sink assembly on a second end opposite said first end, said retention module comprising:

a base comprising mounting lugs fastened to said top surface of said circuit board via mounting apertures accessible only from said bottom surface of said circuit board for fastening said base to said circuit board when said mounting lugs are abutted to said circuit board;

frame elements extending between said mounting lugs to define at least one keep out area interior to said frame elements and at least one keep out area exterior to said frame elements, said frame elements including first and second frame elements extending substantially perpendicular to one another and including an angled frame element extending at an oblique angle to said first and second frame elements; and heat sink retention posts extending vertically upward from said frame elements, said heat sink retention posts arranged in first and second oppositely facing pairs, wherein said first and second pairs are substantially aligned with one another.

17. A heat sink assembly in accordance with claim 16 further comprising a heat sink assembly, a fan element mounted to said heat sink assembly, and a fresh air duct in fluid communication with said fan element.

18. A heat sink assembly in accordance with claim 16 further comprising a heat sink having heat dissipating fins, said heat sink fins configured for airflow along a longitudinal axis and a lateral axis of said heat sink, said heat sink being positioned over said keep out area exterior to said frame elements.

19. A heat sink assembly in accordance with claim 16 wherein said retention posts are substantially centered over said mounting lugs.

20. A beat sink assembly in accordance with claim 16 wherein said retention module comprises positioning tabs for centering a heat sink assembly between said retention posts.

* * * * *